United States Patent
Szczeszynski et al.

(10) Patent No.: US 9,347,998 B2
(45) Date of Patent: May 24, 2016

(54) SYSTEM AND METHOD FOR MEASURING BATTERY VOLTAGE

(71) Applicant: Allegro Microsystems, LLC, Worcester, MA (US)

(72) Inventors: Gregory Szczeszynski, Hollis, NH (US); Bassem Alnahas, Manchester, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 260 days.

(21) Appl. No.: 13/864,515

(22) Filed: Apr. 17, 2013

(65) Prior Publication Data

US 2014/0312914 A1 Oct. 23, 2014

(51) Int. Cl.
*G01R 31/36* (2006.01)
*G01R 19/165* (2006.01)

(52) U.S. Cl.
CPC ...... *G01R 31/3658* (2013.01); *G01R 19/16542* (2013.01); *G01R 31/362* (2013.01); *G01R 31/3606* (2013.01); *G01R 31/3651* (2013.01); *G01R 31/3679* (2013.01)

(58) Field of Classification Search
CPC ........... G01R 31/3606; G01R 31/3651; G01R 31/362; G01R 31/3679; G01R 31/3658; H01M 10/48
USPC ........................................................ 324/427
See application file for complete search history.

(56) References Cited

U.S. PATENT DOCUMENTS

| | | | | |
|---|---|---|---|---|
| 3,541,422 A * | 11/1970 | Ford | ...................... | H02J 7/0077 320/128 |
| 4,394,741 A * | 7/1983 | Lowndes | ............ | B60L 11/1853 320/100 |
| 4,428,040 A * | 1/1984 | Yamashiro | ............. | G04G 19/00 363/62 |
| 5,757,192 A * | 5/1998 | McShane | ........... | G01R 31/3658 324/427 |
| 5,831,435 A * | 11/1998 | Troy | .................. | G01R 31/3648 324/426 |
| 5,965,997 A * | 10/1999 | Alwardi | ............. | G01R 31/3606 320/132 |
| 6,049,210 A * | 4/2000 | Hwang | ............. | G01R 31/3648 320/134 |
| 6,445,162 B1 * | 9/2002 | Mukainakano | ...... | G01R 31/362 320/132 |
| 6,789,026 B2 * | 9/2004 | Barsoukov | ......... | G01R 31/3651 320/104 |
| 7,012,433 B2 * | 3/2006 | Smith | ................ | G01R 31/3627 324/426 |
| 7,592,774 B2 * | 9/2009 | Morimoto | ............ | G01R 31/362 320/116 |
| 7,663,342 B2 * | 2/2010 | Kimball | .................. | H02J 1/102 320/132 |

(Continued)

FOREIGN PATENT DOCUMENTS

| | | | | |
|---|---|---|---|---|
| DE | 3901680 A1 * | 3/1990 | ....... | G01R 19/16542 |
| JP | 03010178 A * | 1/1991 | | |
| WO | WO 2011115640 A1 * | 9/2011 | ............ | H02J 7/0019 |

*Primary Examiner* — Jermele M Hollington
*Assistant Examiner* — Christopher McAndrew
(74) *Attorney, Agent, or Firm* — Daly, Crowley, Mofford & Durkee, LLP

(57) ABSTRACT

An apparatus and method for measuring battery voltage includes a first capacitor configured to receive a charge from a battery. A first switch may be configured to selectively couple the first capacitor to the battery. A second capacitor may be coupled to a reference potential. A second switch may be configured to selectively couple the second capacitor to the first capacitor to transfer at least a portion of the charge on the first capacitor to the second capacitor.

22 Claims, 6 Drawing Sheets

(56) References Cited

U.S. PATENT DOCUMENTS

| | | | | |
|---|---|---|---|---|
| 7,710,119 B2* | 5/2010 | Bertness | G01R 31/3624 | 320/132 |
| 7,746,031 B2* | 6/2010 | Ishishita | H02J 7/0031 | 320/116 |
| 8,427,113 B2* | 4/2013 | Xing | H02J 7/0065 | 320/140 |
| 8,547,064 B2* | 10/2013 | Cooper | G01R 31/3658 | 320/112 |
| 8,878,541 B2* | 11/2014 | Nishizawa | G01R 31/362 | 320/116 |
| 8,975,897 B2* | 3/2015 | Yoshioka | G01R 31/3651 | 320/132 |
| 2001/0019269 A1* | 9/2001 | Yudahira | B60K 6/28 | 324/426 |
| 2003/0204328 A1* | 10/2003 | Tinnemeyer | G01R 31/3606 | 702/30 |
| 2005/0151559 A1* | 7/2005 | Liao | G01R 31/025 | 307/64 |
| 2005/0275408 A1* | 12/2005 | Houldsworth | G01R 31/3606 | 324/431 |
| 2009/0066338 A1* | 3/2009 | Yonezawa | G01R 31/3658 | 324/426 |
| 2009/0079434 A1* | 3/2009 | Osawa | G01R 31/007 | 324/434 |
| 2009/0179650 A1* | 7/2009 | Omagari | G01R 31/3624 | 324/433 |
| 2009/0265121 A1* | 10/2009 | Rocci | G01R 31/362 | 702/57 |
| 2009/0295397 A1* | 12/2009 | Barsukov | G01R 31/3651 | 324/429 |
| 2010/0007351 A1* | 1/2010 | Kurose | G01R 19/2503 | 324/429 |
| 2010/0073004 A1* | 3/2010 | Miyamoto | G01R 19/10 | 324/426 |
| 2010/0085060 A1* | 4/2010 | Ichikawa | G01R 31/3277 | 324/503 |
| 2010/0188092 A1* | 7/2010 | Sekizaki | H01M 10/48 | 324/427 |
| 2010/0194398 A1* | 8/2010 | Kawasumi | H01M 2/34 | 324/430 |
| 2011/0279122 A1* | 11/2011 | Butzmann | G01R 31/3606 | 324/426 |
| 2011/0285539 A1* | 11/2011 | Lee | B60L 11/1866 | 340/636.1 |
| 2012/0139545 A1* | 6/2012 | Makihara | G01R 31/3658 | 324/426 |
| 2012/0139553 A1* | 6/2012 | Nortman | H02J 7/0016 | 324/537 |
| 2012/0146652 A1* | 6/2012 | Aoki | G01R 31/3658 | 324/433 |
| 2012/0182019 A1* | 7/2012 | Nakagawara | G01R 31/3658 | 324/426 |
| 2012/0187925 A1* | 7/2012 | Martin | H02J 1/14 | 323/234 |
| 2012/0188086 A1* | 7/2012 | Xie | G01R 31/3606 | 340/636.18 |
| 2012/0235823 A1* | 9/2012 | Trock | G01R 31/3679 | 340/636.1 |
| 2013/0029245 A1* | 1/2013 | Fisher | G01R 1/06705 | 429/467 |
| 2014/0312914 A1* | 10/2014 | Szczeszynski | G01R 19/16542 | 324/427 |

* cited by examiner

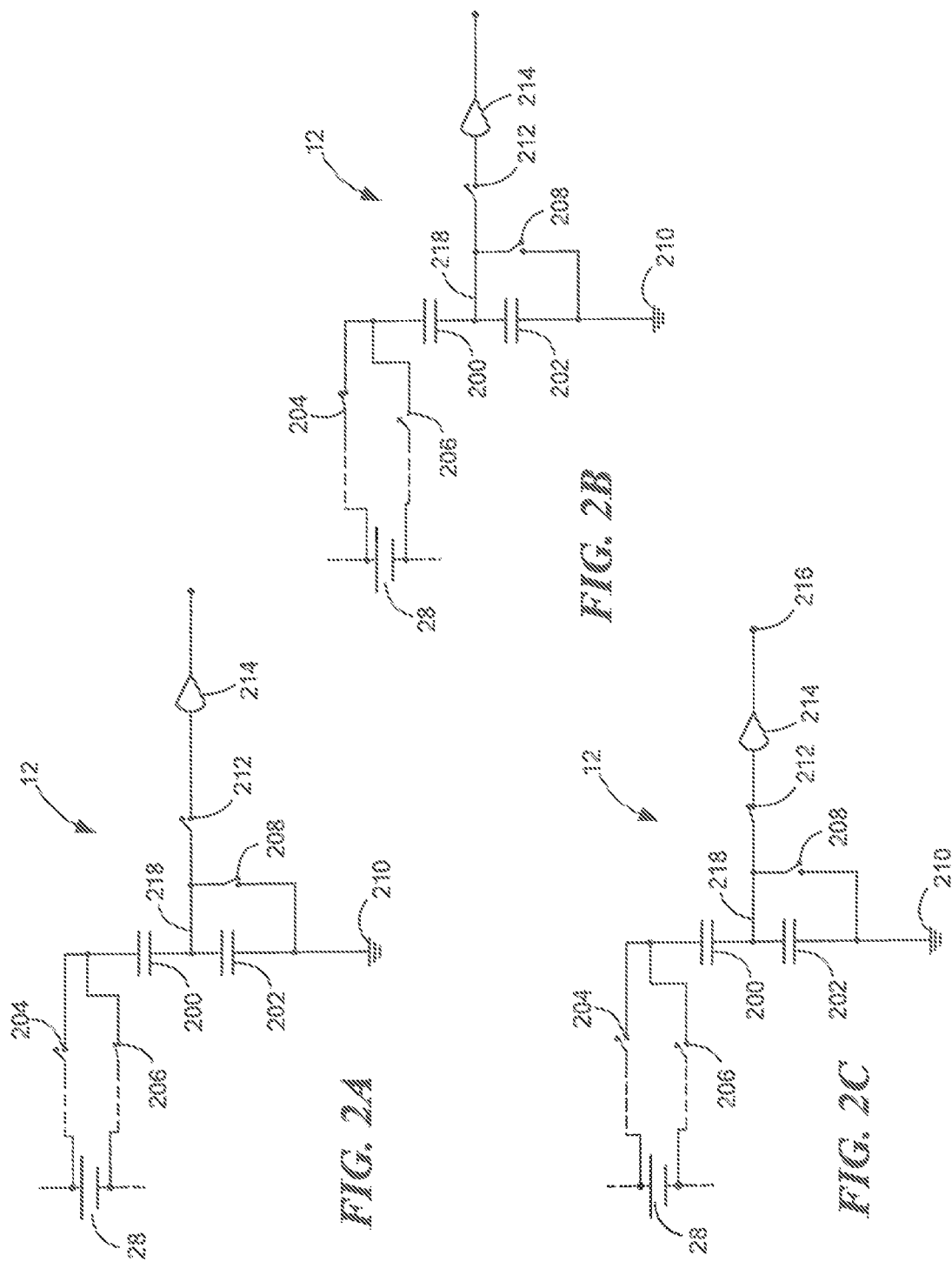

SYSTEM AND METHOD FOR MEASURING BATTERY VOLTAGE

FIELD

This disclosure relates to circuits, systems, and processes for measuring voltage and, in particular, for measuring voltage across a battery.

BACKGROUND

Batteries power a wide array of devices, from cell phones to electric or hybrid cars. Circuits to precisely measure battery voltage are required in many applications. Measuring battery voltage, for example, provides a way to determine how much charge remains in the battery and whether the battery should be replaced or recharged.

In many applications, instead of a single battery, battery banks are used that consists of an array of batteries connected in series, in parallel, or a combination of series and parallel. In order to determine how much charge remains in the battery bank, each battery within the bank should be measured. However, some of the batteries within the battery bank may not be referenced to ground if they are connected in series. The positive and negative terminals of these batteries may sometimes be floating at relatively high voltage, i.e. 60-250 V or more above ground. Measuring the voltage across each of these batteries may require expensive circuitry or may consume a large amount of power during measurement.

SUMMARY

The present disclosure provides systems and methods for measuring battery voltage.

In an embodiment, an apparatus for measuring battery voltage comprises a first capacitor configured to receive a charge from a battery and a first switch configured to selectively couple the first capacitor to the battery. The apparatus also includes a second capacitor having a terminal coupled to a reference potential, and a second switch configured to selectively couple the second capacitor to the first capacitor to transfer at least a portion of the charge on the first capacitor to the second capacitor.

The following features may be included. The first switch may be configured to couple the first capacitor to a first terminal of the battery.

The apparatus may further comprise a third switch configured to couple the first capacitor to a second terminal of the battery.

The first and second capacitors may be coupled in series to provide a common node between the first and second capacitors. The second switch may be configured to couple the common node to the reference potential while the first capacitor is coupled to a first terminal of the battery, and to decouple the common node from the reference potential while the first capacitor is coupled to a second terminal of the battery.

The second switch may be further configured to couple the second capacitor to the first capacitor while the first capacitor is decoupled from the battery, and may be configured to couple the first and second capacitors in a parallel arrangement.

The battery may comprise one or more batteries within a battery stack, and the battery may, in an embodiment, not be referenced to ground.

The switches may comprise transistors, and the apparatus may further comprise a buffer configured to sample a voltage across the second capacitor and provide an output signal representative of the sampled voltage.

In an embodiment, a method for measuring battery voltage comprising the steps of: selectively coupling a first, floating capacitor to a battery to allow charge to flow from the battery to the first capacitor; and selectively coupling a second, fixed-reference capacitor to the first capacitor to transfer at least a portion of the charge from the first capacitor to the second capacitor.

The following features may be included. The first capacitor may be coupled to a first terminal of the battery and a second terminal of the battery.

The first and second capacitors may be coupled in series to provide a common node between the first and second capacitors. The common node may be coupled to a reference potential while the first capacitor is coupled to the first terminal of the battery. The common node may also be decoupled from the reference potential. The first capacitor may be decoupled from the first terminal of the battery and coupled to the second terminal of the battery; and a voltage across the second capacitor may be allowed to change proportionately to a change in voltage across the first capacitor.

In an embodiment, coupling the first capacitor to the positive terminal and decoupling the common node from the reference potential occur substantially simultaneously.

Selectively coupling the second capacitor to the first capacitor may include coupling the second capacitor to the first capacitor while the first capacitor is decoupled from the battery.

Selectively coupling the first capacitor to the battery may comprise coupling the first capacitor to a battery within a battery stack.

The voltage across the second capacitor may be sampled and provided as an output.

BRIEF DESCRIPTION OF THE DRAWINGS

FIG. 2A, FIG. 2B, and FIG. 2C are circuit diagrams showing various operational states of the electronic circuit of FIG. 2 during operation.

Like numbers in the drawings denote like elements. Connectors within circuit or block diagrams may represent single wires, buses, or other types of connections between blocks. A single connector line should not be construed to limit the type of connection to a single wire.

Figure 1:
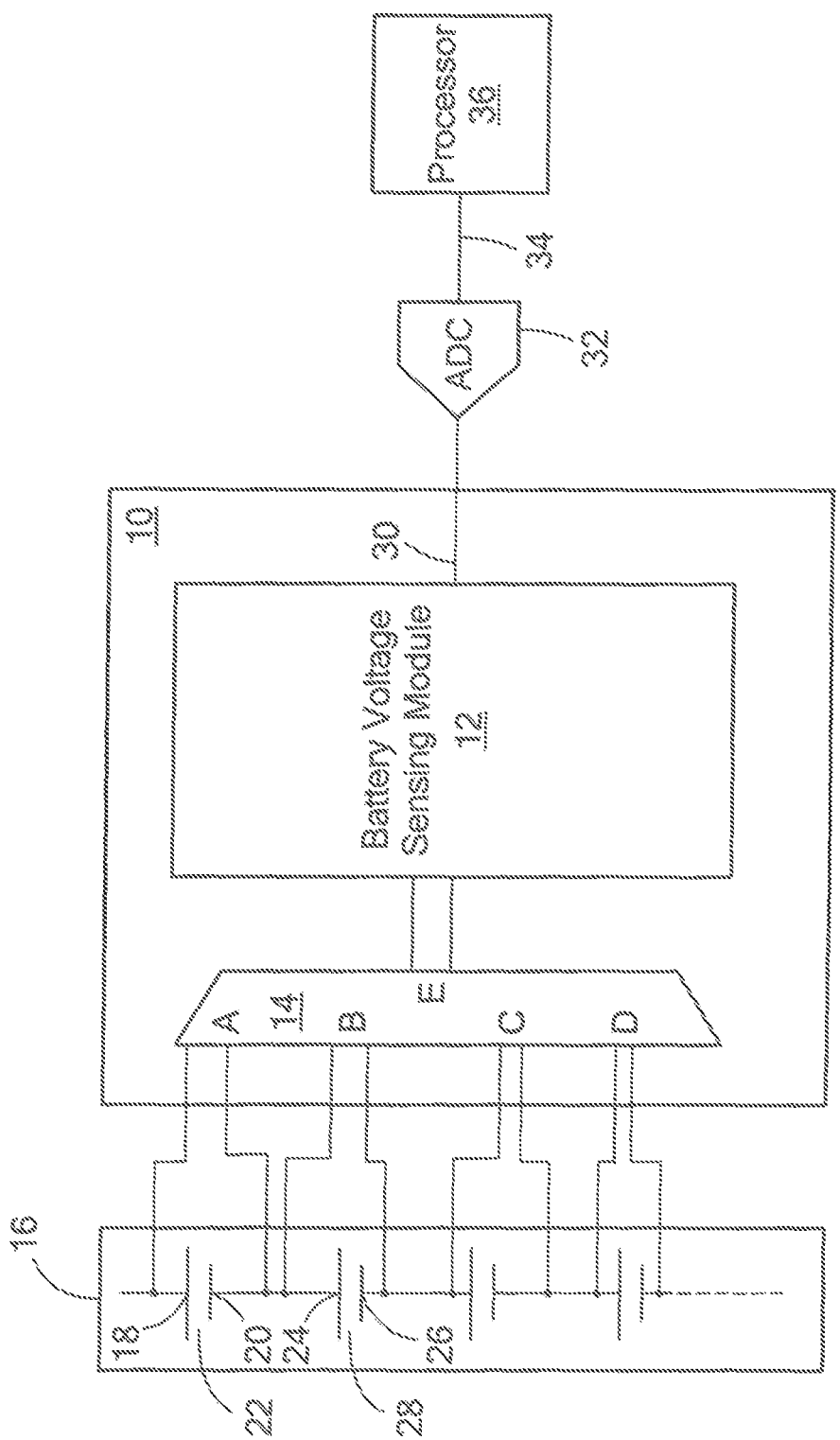
FIG. 1 is a circuit diagram of an electronic circuit for measuring battery voltage.

The figures, including the flowcharts and block diagrams, are provided for exemplary purposes and are not intended to limit the scope of this disclosure. Although the figures depict diagrams and flowcharts with particular numbers of blocks connected in particular arrangements or sequences, these are examples only. Other arrangements and sequences are within the scope of this disclosure.

DETAILED DESCRIPTION

Before describing the present invention, some introductory concepts and terminology are explained. As used herein, the term "battery" is used to describe a variety of electronic elements that can provide electrical energy. These may include any type of rechargeable battery (such as NiCad, NiMH, Lithium-Ion, etc) or non-rechargeable battery (such as alkaline batteries, etc.). The term battery may also include organic batteries, inorganic batteries, combination organic and inorganic batteries, polymer batteries, etc. The term battery may also refer to other types of active and passive electronic devices capable of providing energy such as voltage regulators, current sources, capacitors, inductors, etc.

As used herein, the term "signal" is used to describe an electronic characteristic, analog or digital, that can change over time. In contrast, as used herein, the term "value" is used to describe a digital electronic value that tends to be static, or that tends to change from time to time. However the terms signal and value can be used interchangeably.

As used herein, the term "demand" or "demand signal" is used to describe any electronic signal, analog or digital, that controls an amount of power applied to a motor. For example, as the demand signal changes, the amount of power applied to a motor may also change.

As used herein, the terms "software" and "firmware" may refer to computer readable instructions, stored in a volatile or non-volatile computer readable storage medium (such as a hard drive or memory). For the purposes of this application a computer readable instruction may be carried out in a circuit (electronic circuit) and does not require a "computer". The computer readable instructions, when executed by a processor or circuit, may cause the processor or circuit to perform operations and/or processes described below. The terms "software" and "firmware" may also refer to other types of instructions such as microcode, machine-code, scripts, pseudo code, or any type of computer readable instruction set that can be stored in a computer readable storage medium and executed by a processor or circuit.

This disclosure describes various circuits, systems, methods, and the like for measuring battery voltage. These circuits, systems, and methods may be implemented in hardware, in software, or in a combination of hardware and software. The circuits, systems, and methods may, for example, be implemented in whole or in part by an integrated circuit, by a discrete component circuit, by software instructions stored in a computer readable storage medium and executed by a computer processor or other circuit that can execute software instructions, or by a combination thereof.

Referring to FIG. 1, a circuit 10 may include a battery voltage sensing module 12 and a multiplexer 14 and be suitable for measuring the voltage across each of a plurality of batteries arranged in a battery bank (e.g. a stack of batteries that may be connected in parallel and/or in series). Multiplexer 14 may have multiple inputs (e.g. inputs A, B, C, and D) which may be coupled to an external battery bank 16. Each input may comprise two terminals, which may be respectively coupled to first and second terminals of a battery within battery bank 16. In an embodiment, the first terminal may be the positive terminal of the battery and the second terminal may be the negative terminal of the battery, or vice versa. For example, as shown, the positive terminal 18 and the negative terminal 20 of battery 22 may be coupled to input A; the positive terminal 24 and the negative terminal 26 of battery 28, may be coupled to input B, and so on. Although shown as having four inputs, multiplexer 14 may have more or less inputs depending on the application, the number of batteries within battery bank 16, etc.

Multiplexer 14 may also include an output E, coupled to the battery voltage sensing module 12. The multiplexer may act as a switch that routes any one of its inputs to the output E so that the positive and negative terminals of a battery within battery bank 16 are coupled to the battery voltage sensing module 12.

The battery voltage sensing module 12 may produce a battery voltage signal 30 as an output. The battery voltage signal 30 may be indicative of the voltage across a battery within battery bank 16, as will be discussed below. The battery voltage signal 30 may be an analog signal, a digital signal, a serial data signal, or any other signal that can represent the measured voltage across a battery within battery bank 16.

Battery voltage signal 30 may be an output of the integrated circuit 10, and may be received by external analog-to-digital converter (ADC) 32. One skilled in the art will recognize that if battery voltage signal 30 is a digital signal, then ADC 32 may be omitted. ADC 32 may convert battery voltage signal 30 to a digital signal 34, which may then be received by processor 36 for subsequent processing. In an embodiment, the multiplexer 14 can also be controlled by the processor 36, or by another processor or circuit.

Although not shown, the integrated circuit 10 may also include other circuits and systems. For example, the integrated circuit 10 may include a battery charging circuit, an alarm circuit that provides an indication if a battery voltage is too high or low, voltage regulators, ADC circuits, processors, and/or other circuits depending upon the design of the integrated circuit 10.

Figure 2:
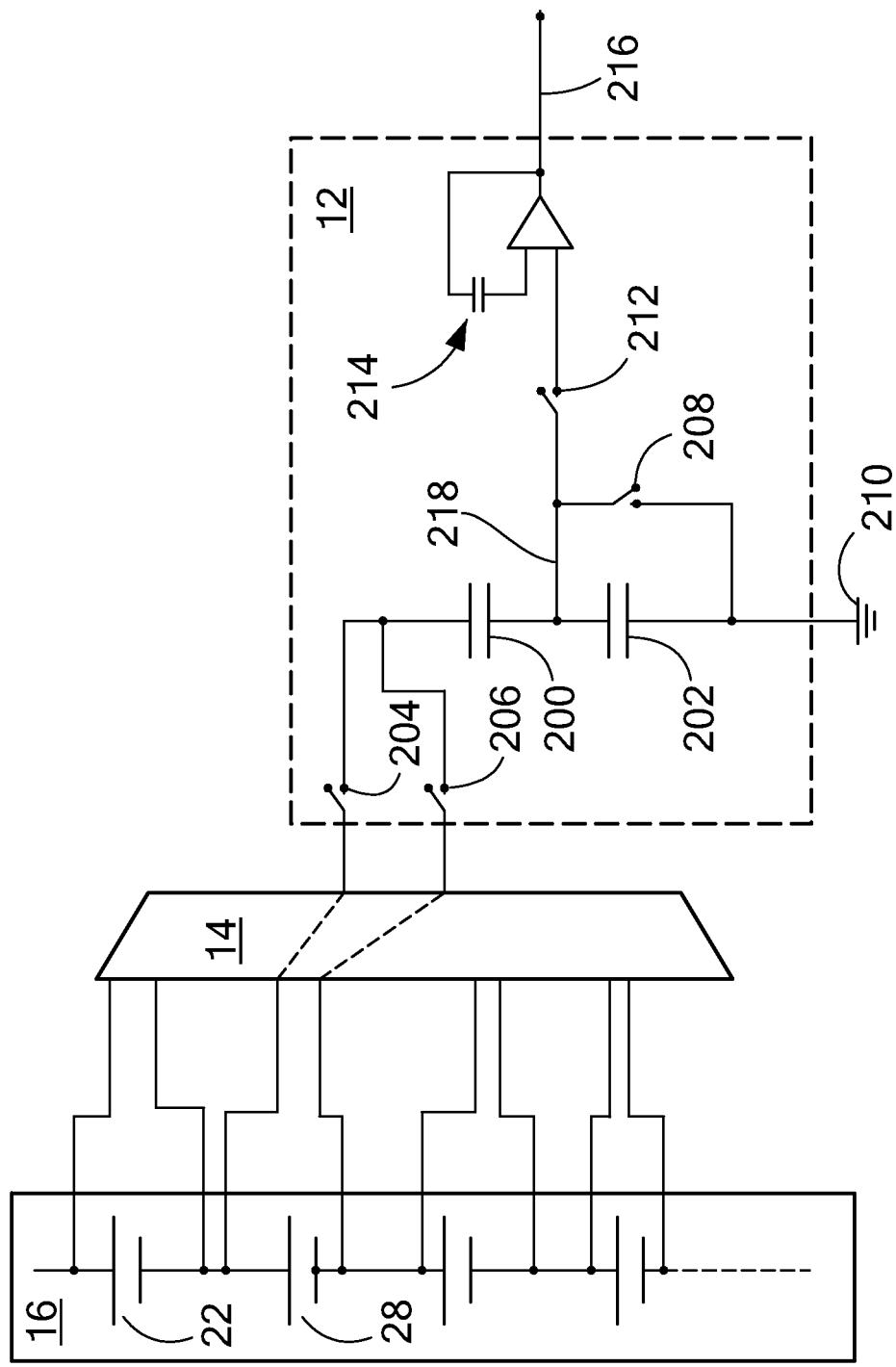
FIG. 2 is a circuit diagram of an embodiment of an electronic circuit for measuring battery voltage.

FIG. 2 is a circuit diagram showing an embodiment of battery voltage sensing module 12. As shown, battery voltage sensing module 12 may include a first, floating capacitor 200, and a second capacitor 202 that may be referenced to ground 204.

As shown, multiplexer 14 may couple the positive and negative terminals of a battery (e.g. battery 28) to the inputs of battery voltage sensing module 12. Capacitor 200 may be selectively coupled to the positive terminal of battery 28 through switch 204, and selectively coupled to the negative terminal of battery 28 through switch 206.

In an embodiment, floating capacitor 200 may be a high voltage capacitor. Because the battery sampled by battery voltage sensing module 12 may be floating, the voltage at the positive and negative terminals of the battery may be 50V or higher. Accordingly, floating capacitor 200 may be chosen as a high voltage capacitor that can withstand such voltages. In an embodiment, floating capacitor 200 may be a high voltage capacitor constructed on a silicon die.

Capacitor 202 may not be required to be a high voltage capacitor. As will be discussed below, the voltage seen by capacitor 202 may not be as high as the voltage seen by floating capacitor 200.

Battery voltage sensing module 12 may also include a switch 208 configured to couple a terminal of floating capacitor 200 and a terminal of capacitor 202 (i.e. a common node between the capacitors) to reference potential 210. As shown in FIG. 2, reference potential 210 may be ground (i.e. 0V). However, the reference potential (i.e. reference voltage) may also be any other desired voltage according to design requirements.

Battery voltage sensing module 12 may also include switch 212 coupled to the second capacitor 202. Switch 212, when closed, may provide the voltage across capacitor 202 as an input to sample and hold module 214. Sample and hold module 214 may be a buffer capable of sampling the voltage across capacitor 202, and providing a signal 216 as an output that is representative of the voltage across battery 28.

In an embodiment, the switches shown in the figures may be transistors, BJTs, FETs, or other types of switches or circuits that can selectively couple or connect electrical terminals together.

FIGS. 2A, 2B, and 2C illustrate battery voltage sensing module 12 in operation when coupled to battery 28 for voltage measurement. For simplicity of illustration, multiplexer 14 is not shown in FIG. 2A-2C.

As shown, floating capacitor 200 and capacitor 202 may be coupled together to form a common node (e.g. node 218). In FIG. 2A, switch 208 is closed which may couple node 218 to reference potential 210. When closed, switch 208 may short circuit capacitor 202 so that the voltage across capacitor 202 is zero, and may tie one terminal of floating capacitor 200 to reference potential 210.

In FIG. 2A, switch 206 may also be closed to selectively couple floating capacitor 200 to a first terminal (e.g. the negative terminal) of battery 28. Switches 204 and 212 may be open. This may allow battery 28 to charge capacitor 200 so that the voltage across floating capacitor 200 becomes equal to the difference between the voltage at the negative terminal of battery 28 and reference potential 210. Assuming reference potential 210 is ground, the voltage across floating capacitor 200 may be charged to the voltage at the negative terminal of battery 28. In this arrangement, if battery 28 is a battery within a series of batteries (e.g. within battery bank 16 in FIG. 2), then the voltage across floating capacitor 200 may be relatively high. In an embodiment, the voltage across floating capacitor 200 may be 50V or more. Accordingly, floating capacitor 200 may be designed to withstand floating voltages within a series of batteries, e.g. voltages of 50V or more.

After floating capacitor 200 is charged to the voltage of the negative terminal of battery 28, switch 206 may open as shown in FIG. 2B. This may decouple the negative terminal of battery 28 from floating capacitor 200. In addition, switch 208 may open so that node 218 is decoupled from reference potential 210 and switch 204 may close to couple floating capacitor 200 to the second (e.g. positive) terminal of battery 28.

Recall that prior to switch 204 closing, floating capacitor 200 was charged to the level of the negative terminal of battery 28. When switch 204 now closes, if a voltage potential exists across battery 28, the positive terminal of battery 28 may now increase the charge on floating capacitor 200 so that the voltage on floating capacitor 200 increases to the voltage of the positive terminal of battery 28. The amount of voltage increase across floating capacitor 200 may be proportional to (or equal to) the voltage across battery 28.

As switch 204 closes, switch 208 may open. Opening switch 208 decouples the node 218 from reference potential 210 so that the voltage at node 218 is no longer clamped to reference potential 210.

In an embodiment, switch 206 and 208 may open, and switch 204 may close, substantially simultaneously. These switches may, for example, be controlled by a single signal which, when asserted, causes the switches to open and close at the same time. In other embodiments, opening and closing the switches 204, 206, and 208 may occur in a particular sequence according to design requirements.

As switch 208 opens, the voltage at node 218 is allowed to float. In addition, as switch 204 closes and switch 206 opens, the charge on capacitor 200 may increase. Since capacitor 200 has already been charged, and since that charge is now increasing, releasing node 218 from ground may allow charge to transfer from capacitor 200 to capacitor 202. In other words, the charge across capacitor 200 and the increase in charge across capacitor 200 caused by opening switch 206 and closing switch 204 may cause a proportional amount of charge to transfer to capacitor 202.

The charge that transfers to capacitor 202, and thus the resulting voltage across capacitor 202, may be indicative of (e.g. proportional to) the voltage across battery 28. For example, as noted above, the voltage across capacitor 200 is substantially equal to the voltage at the negative terminal of battery 28. As switch 208 opens and allows capacitor 202 to be charged by capacitor 200, switch 206 opens and switch 204 closes, which may increase the charge on the top plate of capacitor 200 as charge is being transferred from the bottom plate of capacitor 200 to capacitor 202. This simultaneous increase in the charge on the top plate of capacitor 200 may vary the amount of charge transferred to capacitor 202.

The variance in charge may be proportional to the voltage across battery 28. For example, if the voltage across battery 28 is zero (i.e. battery 28 is dead), the increase in charge on capacitor 200 as switch 206 opens and switch 204 closes will be zero. Since there is no increase in voltage caused by the potential across the battery, the resulting charge across capacitor 202 will not be affected by the battery. On the other hand, if there is a non-zero voltage across battery 28, the charge on capacitor 200 will increase as switch 206 is opened and switch 204 is closed. Thus, this increase in charge caused by the battery will affect the amount of charge on (and the final voltage across) battery 202.

In an embodiment, if the voltage across battery 28 is positive, the voltage across capacitor 202 may be increased by a proportional amount, as described above. If the voltage across battery 28 is negative, the voltage across capacitor 202 may be decreased a proportional amount, as described above.

The values of capacitors 200 and 202 may be chosen based on design requirements of the battery voltage sensing module 12. In an embodiment, the capacitance of capacitor 202 may be smaller than the capacitance of capacitor 200 so that, when switch 208 opens and the voltage at node 218 stabilizes, the voltage across capacitor 202 is less than the voltage across capacitor 200. In another embodiment, the capacitance of capacitor 202 may be larger than the capacitance of capacitor 200.

In an embodiment, capacitor 202 need not be a high voltage capacitor because it is referenced to ground and because the voltage across capacitor 202 may be relatively small. As noted above, the voltage across capacitor 202 may be proportional to the voltage across battery 28, and/or by the ratio of capacitance of capacitors 200 and 202. In embodiments, the batteries and capacitors may be chosen so that the resulting voltage across capacitor 202 will not require capacitor 202 to be a high voltage capacitor.

In FIG. 2C, switch 204 may open after the charge has been transferred from capacitor 200 to capacitor 202. The switch 212 may then close so the sample and hold buffer 214 can sample the voltage across capacitor 202. Sample and hold buffer 214 may then hold (i.e. maintain) output 216 at the same voltage level as the voltage across capacitor 202 until sample and hold buffer 214 takes a subsequent sample.

After sample and hold buffer 214 latches and holds its output, battery voltage sensing module 12 may sample the voltage across another battery, as described above. Multiplexer 14 may route, for example, the positive and negative terminals of battery 22 (or another battery) to the switches 204 and 206 (See FIG. 2) and then repeat the process described above with respect to FIG. 2A-2C.

Figure 3:
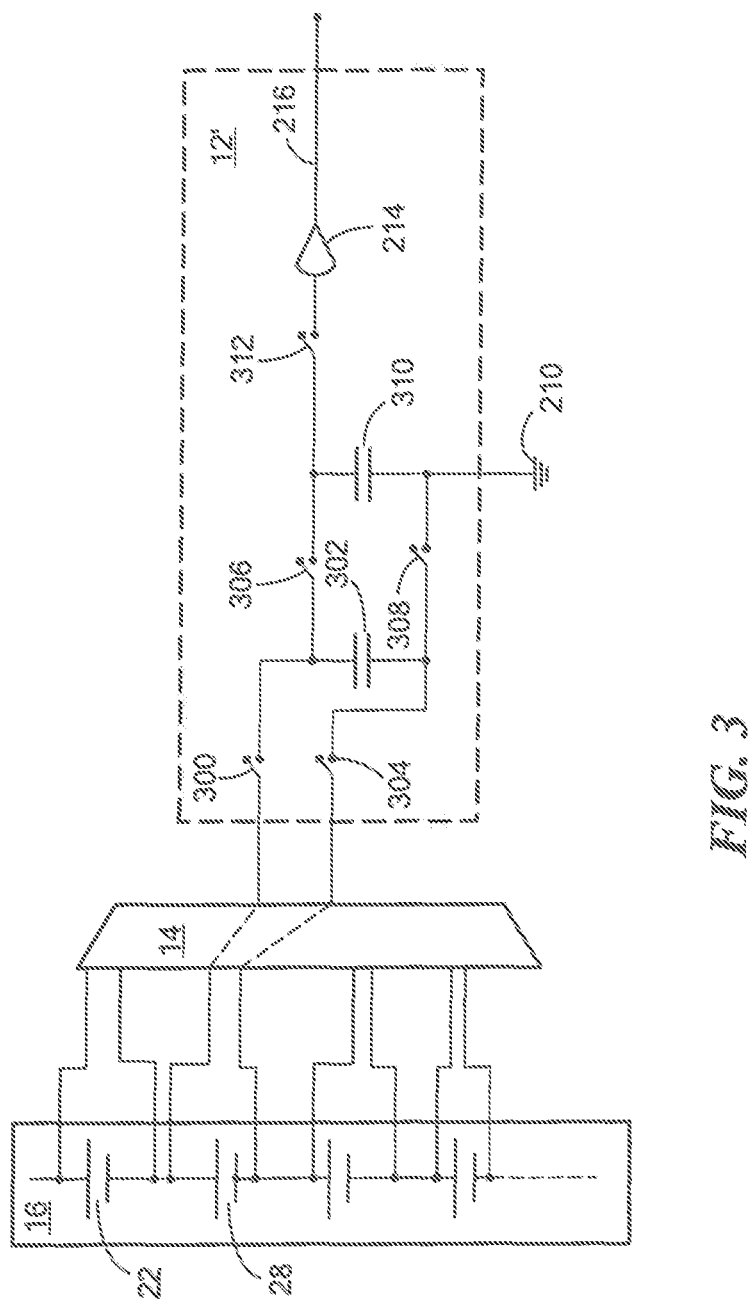
FIG. 3 is a circuit diagram of an alternative embodiment of an electronic circuit for measuring battery voltage.

FIG. 3 shows another embodiment of battery voltage sensing module 12'. In FIG. 3, battery sensing module 12' may include switch 300 that couples a first terminal of a battery to a terminal of floating capacitor 302, and switch 304 that couples a second terminal of a battery to a second terminal of capacitor 302.

Battery voltage sensing module 12' may also include a switch 306 that selectively couples a terminal of capacitor 302 to a terminal of capacitor 310, and a switch 308 that selectively couples a second terminal of capacitor 302 to reference potential 210 (e.g. ground). A second terminal of capacitor 310 is also coupled to ground 210.

Although not shown, an additional switch may be connected in parallel to capacitor 310. Closing this additional switch may short capacitor 310 to ground so that there is no voltage across capacitor 310 prior to capacitor 310 receiving charge from capacitor 302.

Figure 3A:
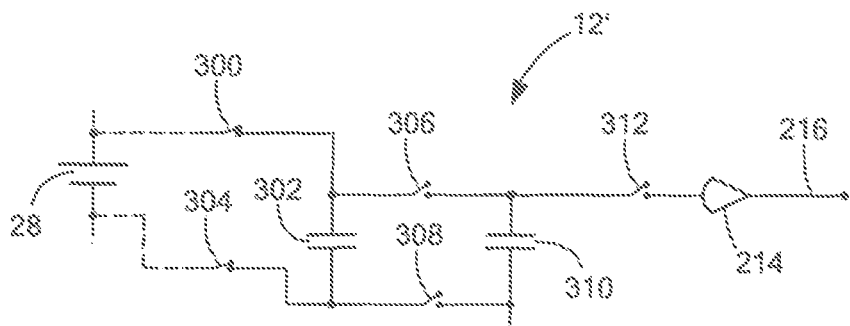
FIG. 3A, FIG. 3B, and FIG. 3C are circuit diagrams showing various operational states of the electronic circuit of FIG. 3 during operation.
Figure 3B:
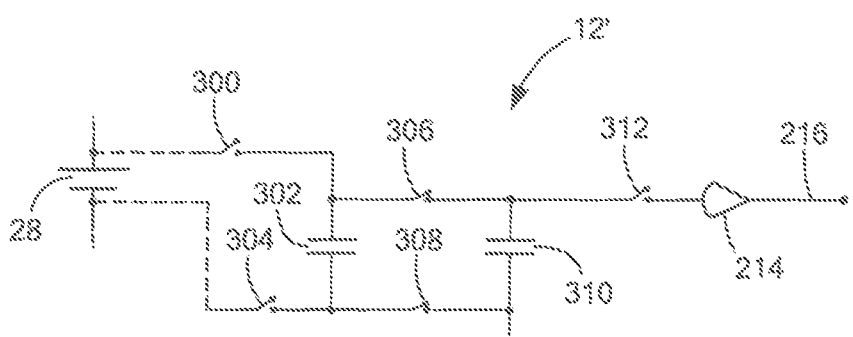
Figure 3C:
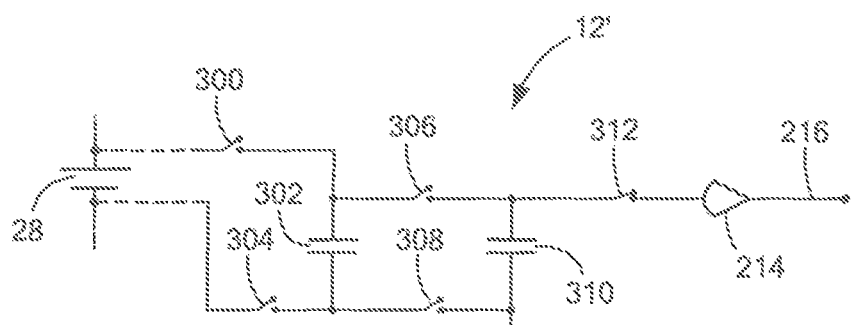

FIG. 3A, 3B, and 3C show the embodiment of the battery voltage sensing module 12' of FIG. 3 in operation when coupled to battery 28 for voltage measurement. In FIG. 3A, switches 300 and 304 are closed and switches 306, 308, and 312 are open. While switches 300 and 304 are closed, one terminal of capacitor 302 is coupled to a first (e.g. positive) terminal of battery 28 and the other terminal of capacitor 302 is coupled to a second (e.g. negative) terminal of battery 28. In this arrangement, battery 28 will charge capacitor 302 so that the voltage across capacitor 302 is equal to the voltage across battery 28.

Because battery 28 may be one battery within a series-connected bank of batteries, the voltage at the terminals of battery 28 may not be referenced to ground. In an embodiment, the voltage at the terminals of battery 28 may be up to 50V or higher. Accordingly, capacitor 302 may be a high voltage capacitor designed to withstand voltages up to 50V or higher.

Because switches 306 and 308 are open, capacitor 302 may be isolated from the rest of battery voltage sensing module 12'. Therefore, if battery 28 is not referenced to ground, capacitor 302 will also not be referenced to ground while switches 306 and 308 are open and switches 300 and 304 are closed.

When capacitor 302 has been charged by battery 28, switches 300 and 304 may open and switches 306 and 308 may close, as shown in FIG. 3B. This may disconnect and isolate capacitor 302 from battery 28 so that capacitor 302 no longer receives electrical energy from battery 28.

Closing switch 308 may reference charged capacitor 302 to ground. If battery 28 is floating, closing switch 308 may act to shift the voltage across capacitor 302 so that the voltage across capacitor 302 is referenced to ground.

Closing switch 306 allows at least a portion of the charge on capacitor 302 to transfer to capacitor 310. In other words, the charge on capacitor 302, received from battery 28, may now charge capacitor 310. In an embodiment, capacitor 310 may not be required to be a high voltage capacitor, because switch 308 is closed and capacitor 302 is referenced to ground when charge is transferred from capacitor 302 to capacitor 310.

Once charge has been transferred to capacitor 310, switch 312 may close so that sample and hold buffer 214 may sample the voltage across capacitor 310 and provide the value of the voltage across capacitor 310 as output 216 (FIG. 3C). Because capacitor 310 was charged by capacitor 302, which was charged by battery 28, the output 216 may be proportional to the voltage across battery 28. The multiplexer 14 (See e.g. FIG. 3) may then select and route a different battery to battery voltage sensing module so the operation can begin again at FIG. 3A.

Although not shown, switch 312 may also be closed in FIG. 3A so as to facilitate repeated measurements of different batteries. In such an embodiment, the arrangement shown in FIG. 3C may not be needed. For example, in FIG. 3A, if switch 312 is closed, sample and hold buffer 214 may sample the voltage across capacitor 310 while capacitor 302 is being charged by battery 28. Then, in FIG. 3B, switch 312 may open so that capacitor 310 can receive charge from capacitor 302. The multiplexer 14 (FIG. 3) may then select and route a different battery to battery voltage sensing module so the operation can begin again at FIG. 3A, without needing to proceed to the arrangement shown in FIG. 3C.

Figure 4:
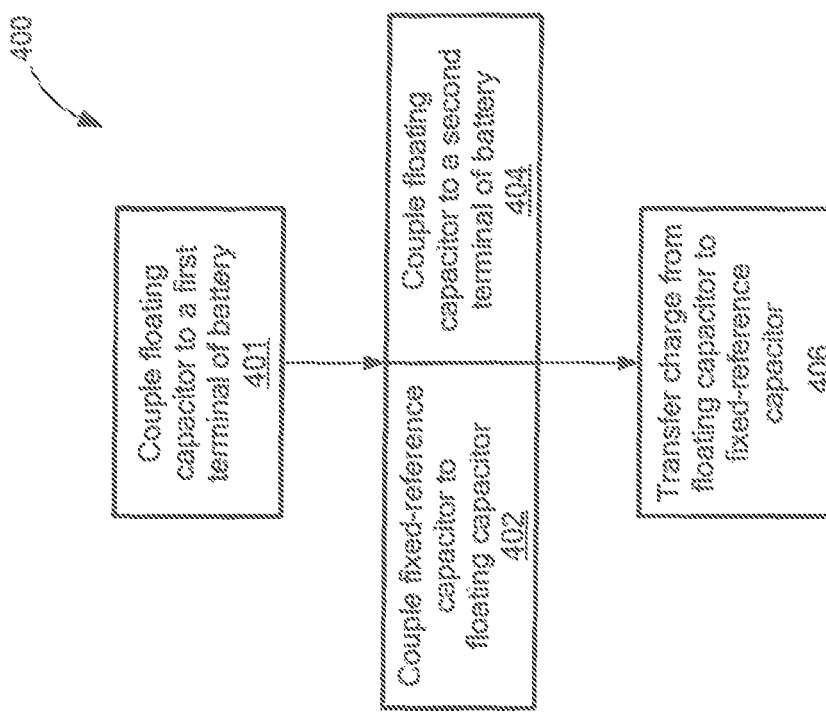
FIG. 4 is a flowchart illustrating a method for measuring battery voltage with the electronic circuit of FIG. 2.

FIG. 4 is a flowchart illustrating a method 400 for sensing battery voltage. The method 400 may be associated with the embodiment of battery voltage sensing module 12 shown in FIG. 2.

In block 401, a floating capacitor (e.g. capacitor 200) may be coupled to a first terminal of a battery, e.g. by closing switch 206. In block 402, a fixed-reference capacitor (e.g. capacitor 202) may be coupled to the floating capacitor (e.g. by opening switch 208). In block 404, the floating capacitor (e.g. capacitor 200) may be coupled to a second of the battery. Blocks 402 and 404 are displayed side-to-side within the flowchart because they may occur substantially simultaneously. The operations in blocks 402 and 404 may allow charge to transfer from the floating capacitor to the fixed reference capacitor (i.e. from capacitor 200 to capacitor 202) as indicated in block 406.

Figure 5:
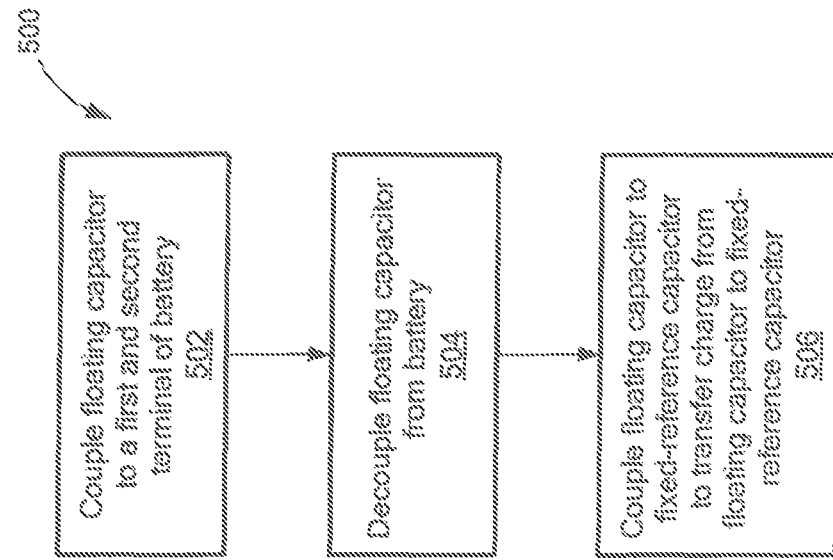
FIG. 5 is a flowchart illustrating a method for measuring battery voltage with the electronic circuit of FIG. 3.

FIG. 5 is a flowchart illustrating a method 500 for sensing battery voltage. The method 500 may be associated with the embodiment of battery voltage sensing module 12' shown in FIG. 4

In block 502, a floating capacitor (e.g. capacitor 302) may be coupled (e.g. by closing switches 306 and 308) to a first and second terminal of a battery. In block 504, the floating capacitor may be decoupled from the battery (e.g. by opening switches 306 and 308). In bock 506, the floating capacitor may be coupled to a fixed-reference capacitor (e.g. capacitor 310) to transfer charge to the fixed-reference capacitor.

Having described various embodiments, which serve to illustrate various concepts, structures and techniques, which are the subject of this patent, it will now become apparent to those of ordinary skill in the art that other embodiments incorporating these concepts, structures and techniques may be used. Accordingly, the scope of the patent should not be limited to the described embodiments but rather should be limited only by the spirit and scope of the following claims.

What is claimed is:

1. An apparatus for measuring battery voltage comprising:
   a first capacitor configured to receive a charge from a battery;
   a first switch configured to selectively couple the first capacitor to the battery;
   a second capacitor having a first terminal coupled to a reference potential and second terminal coupled to the first capacitor to form a node between the capacitors;
   a second switch configured to allow at least a portion of the charge on the first capacitor to transfer to the second capacitor to generate a voltage across the second capacitor that is proportional to the battery voltage; and
   a measurement circuit configured to measure the generated voltage at the node between the capacitors and provide an output signal representing the battery voltage.

2. The apparatus of claim 1 wherein the first switch is configured to couple the first capacitor to a first terminal of the battery.

3. The apparatus of claim 2 further comprising a third switch configured to couple the first capacitor to a second terminal of the battery.

4. The apparatus of claim 1 wherein the first and second capacitors are coupled in series to form the common node between the first and second capacitors.

5. The apparatus of claim 4 wherein the second switch is configured to couple the common node to the reference potential while the first capacitor is coupled to a first terminal of the battery, and to decouple the common node from the reference potential while the first capacitor is coupled to a second terminal of the battery.

6. The apparatus of claim 1 wherein the second switch is further configured to couple the second capacitor to the first capacitor while the first capacitor is decoupled from the battery.

7. The apparatus of claim 1 wherein the second switch is further configured to couple the first and second capacitors in a parallel arrangement.

8. The apparatus of claim 1 wherein the battery comprises one or more batteries within a battery stack.

9. The apparatus of claim 1 wherein the battery is not referenced to ground.

10. The apparatus of claim 1 wherein the switches comprise transistors.

11. The apparatus of claim 1 wherein the measurement circuit comprises a buffer configured to sample a voltage across the second capacitor and provide the output signal.

12. A method for measuring battery voltage comprising the steps of:
    selectively coupling a first, floating capacitor to a battery to allow charge to flow from the battery to the first capacitor;
    selectively operating a switch to allow at least a portion of the charge from the first capacitor to transfer to a second capacitor to generate a voltage across the second capacitor that is proportional to the battery voltage; and
    measuring the generated voltage across the second capacitor; and
    providing an output signal based on the generated voltage across the second capacitor and representative of the battery voltage
    wherein a first terminal of the second capacitor is coupled to a reference potential and a second terminal of the second capacitor is coupled to the first capacitor.

13. The method of claim 12 further comprising coupling the first capacitor to a first terminal of the battery.

14. The method of claim 12 further comprising coupling the first capacitor to a second terminal of the battery.

15. The method of claim 12 further comprising coupling the first and second capacitors in series to provide a common node between the first and second capacitors.

16. The method of claim 15 further comprising:
    coupling the common node to a reference potential while the first capacitor is coupled to a first terminal of the battery;
    decoupling the common node from the reference potential;
    decoupling the first capacitor from the first terminal of the battery; and
    coupling the first capacitor to a second terminal of the battery.

17. The method of claim 16 wherein coupling the first capacitor to the second terminal and decoupling the common node from the reference potential occur substantially simultaneously.

18. The method of claim 12 wherein selectively coupling the second capacitor to the first capacitor includes coupling the second capacitor to the first capacitor while the first capacitor is decoupled from the battery.

19. The method of claim 12 wherein selectively coupling the first capacitor to the battery comprises coupling the first capacitor to a battery within a battery stack.

20. The method of claim 12 wherein measuring the voltage comprises buffering the voltage across the second capacitor; and providing the output signal comprises providing the buffered voltage as an output.

21. The apparatus of claim 1 wherein the second capacitor is coupled to the first capacitor through a switch.

22. The method of claim 12 wherein the second capacitor is coupled to the first capacitor through a switch.

* * * * *